United States Patent
Ge et al.

(10) Patent No.: US 11,740,310 B2
(45) Date of Patent: Aug. 29, 2023

(54) POSITIONING METHOD FOR MAGNETIC RESONANCE IMAGING SYSTEM, AND MAGNETIC RESONANCE IMAGING SYSTEM

(71) Applicant: GE PRECISION HEALTHCARE LLC, Wauwatosa, WI (US)

(72) Inventors: Yaan Ge, Beijing (CN); Kun Wang, Beijing (CN); Qingyu Dai, Beijing (CN); Liya Ma, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/656,139

(22) Filed: Mar. 23, 2022

(65) Prior Publication Data
US 2022/0317216 A1 Oct. 6, 2022

(30) Foreign Application Priority Data

Mar. 30, 2021 (CN) .......................... 202110339732.3

(51) Int. Cl.
*G01R 33/54* (2006.01)
*G01R 33/341* (2006.01)
*G01R 33/563* (2006.01)
*G01R 33/565* (2006.01)

(52) U.S. Cl.
CPC ......... *G01R 33/543* (2013.01); *G01R 33/341* (2013.01); *G01R 33/56308* (2013.01); *G01R 33/56509* (2013.01)

(58) Field of Classification Search
None
See application file for complete search history.

(56) References Cited

U.S. PATENT DOCUMENTS

| | | | |
|---|---|---|---|
| 9,626,777 B2 | 4/2017 | Forman | |
| 10,048,347 B2 | 8/2018 | Kudielka | |
| 2006/0058630 A1* | 3/2006 | Harvey | G01R 33/56518 600/410 |
| 2007/0053503 A1* | 3/2007 | Zelnik | A61B 6/04 378/205 |
| 2009/0264735 A1 | 10/2009 | Steckner | |
| 2010/0189328 A1* | 7/2010 | Boernert | G01R 33/56375 382/131 |
| 2016/0109546 A1* | 4/2016 | Machii | G01R 33/34 324/322 |
| 2019/0369198 A1* | 12/2019 | Chang | G01R 33/3664 |

(Continued)

OTHER PUBLICATIONS

Giannakopoulos et al., "Magnetic-resonance-based electrical property mapping using Global Maxwell Tomography with an 8-channel head coil at 7 Tesla: a simulation study—arXiv 2003.09285v1" Mar. 20, 2020, 12 pages.

*Primary Examiner* — Rodney E Fuller (57) ABSTRACT

A positioning method for a magnetic resonance imaging system comprises: acquiring a scattering parameter curve of a body coil during a process in which an examination table carrying a subject under examination enters a scanning bore of the magnetic resonance imaging system; acquiring the position of a part to be examined of the subject under examination on the basis of the scattering parameter curve; and moving the examination table on the basis of the position of the part to be examined such that the part to be examined is located at the center of the scanning bore.

15 Claims, 8 Drawing Sheets

(56) References Cited

U.S. PATENT DOCUMENTS

| | | | |
|---|---|---|---|
| 2020/0093452 A1* | 3/2020 | Bai | A61B 6/465 |
| 2020/0138382 A1* | 5/2020 | Cao | G06T 7/0014 |
| 2022/0099764 A1* | 3/2022 | Hamada | G01R 33/543 |
| 2022/0229127 A1* | 7/2022 | Kawajiri | G01R 33/3664 |

* cited by examiner

POSITIONING METHOD FOR MAGNETIC RESONANCE IMAGING SYSTEM, AND MAGNETIC RESONANCE IMAGING SYSTEM

CROSS REFERENCE

The present application claims priority and benefit of Chinese Patent Application No. 202110339732.3 filed on Mar. 30, 2021, which is incorporated herein by reference in its entirety.

FIELD OF THE INVENTION

The present invention relates to a medical imaging technology, and more specifically, to a positioning method for a magnetic resonance imaging system, a magnetic resonance imaging system, and a non-transitory computer-readable storage medium.

BACKGROUND OF THE INVENTION

Magnetic resonance imaging (MRI), as a medical imaging modality, can obtain images of the human body without using X-rays or other ionizing radiation. MRI utilizes a magnet having a strong magnetic field to generate a main magnetic field B0. When a part to be imaged in the human body is positioned in the main magnetic field B0, nuclear spins associated with hydrogen nuclei in human tissue are polarized, so that the tissue of the part to be imaged generates a longitudinal magnetization vector at a macroscopic level. After a radio-frequency field B1 intersecting the direction of the main magnetic field B0 is applied, the direction of rotation of protons changes so that the tissue of the part to be imaged generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the part to be imaged can be reconstructed based on the acquired signal. A gradient system is configured to transmit a layer selection gradient pulse, a phase-coded gradient pulse, and a frequency-coded gradient pulse (also referred to as a read-out gradient pulse) to provide three-dimensional position information for the aforementioned magnetic resonance signal to implement image reconstruction.

Before magnetic resonance imaging scanning is performed, it is necessary to move, by means of an examination table, a part to be examined of a subject under examination to the center of a scanning bore of a magnetic resonance imaging system to undergo scanning and imaging. There are different solutions for determining the specific position of the part to be examined of the subject under examination.

Generally, an operator or a doctor can use a manual positioning approach, that is, during a process in which the examination table enters the scanning bore, a laser device located at the center of the scanning bore will project a mark on the body of the subject under examination, for example, a cross mark. The operator can determine the current position to be the part to be examined on the basis of the projected mark, that is, positioning for scanning is completed. However, this positioning approach requires a user to carry out relevant operations in a scanning room, the operation process is complicated, and the laser device may pose a potential safety risk to the subject under examination.

In addition, automatic positioning can also be carried out by means of a camera. Specifically, before scanning is performed, an image of the subject under examination is captured by a camera mounted in the scanning room, the position of the part to be examined of the subject under examination is acquired on the basis of the processed image, and the examination table is moved such that the part to be examined of the subject under examination is located at the center of the scanning bore. However, such positioning approach incurs high costs, and is complex to implement and apply.

BRIEF DESCRIPTION OF THE INVENTION

The present invention provides a positioning method for a magnetic resonance imaging system, a magnetic resonance imaging system, and a non-transitory computer-readable storage medium.

Provided in an exemplary embodiment of the present invention is a positioning method for a magnetic resonance imaging system. The positioning method comprises: acquiring a scattering parameter curve of a body coil during a process in which an examination table carrying a subject under examination enters a scanning bore of a magnetic resonance imaging system; acquiring the position of a part to be examined of the subject under examination on the basis of the scattering parameter curve; and moving the examination table on the basis of the position of the part to be examined such that the part to be examined is located at the center of the scanning bore.

Specifically, the acquiring the scattering parameter curve of the body coil comprises acquiring scattering parameters when the subject under examination is located at different positions of the scanning bore, and generating the scattering parameter curve on the basis of the scattering parameters acquired at the different positions.

Specifically, the acquiring the scattering parameters at the different positions comprises acquiring the scattering parameters of the body coil on the basis of reflected power and output power of the body coil when the subject under examination is located at the different positions.

Specifically, the acquiring the scattering parameters at the different positions further comprises applying preset input power to the body coil, monitoring the output power and reflected power of the body coil when the subject under examination is located at the different positions, and acquiring the scattering parameters corresponding to the different positions on the basis of a ratio of the reflected power to the output power.

Specifically, the acquiring the position of the part to be examined of the subject under examination comprises determining the position of a local coil or a surface coil on the basis of a peak or valley position in the scattering parameter curve, and the position of the local coil or the surface coil is the position of the part to be examined.

Specifically, the acquiring the position of the part to be examined of the subject under examination comprises acquiring the distance between the head or the foot and the lower abdomen of the subject under examination on the basis of the valley position in the scattering parameter curve, and estimating the distance between the head or the foot and the part to be examined on the basis of the distance between the head or the foot and the lower abdomen, so as to acquire the position of the part to be examined.

Further provided in an exemplary embodiment of the present invention is a non-transitory computer-readable storage medium for storing a computer program which, when executed by a computer, causes the computer to execute instructions of the positioning method for the magnetic resonance imaging system.

Further provided in an exemplary embodiment of the present invention is a magnetic resonance imaging system. The system comprises a main magnet, a body coil configured to transmit or receive a radio frequency signal, an examination table configured to carry and move a subject under examination, and a positioning device. The main magnet defines a scanning bore therein. The positioning device comprises a parameter scanning module, a part determination module and a control module. The parameter scanning part is configured to acquire a scattering parameter curve of the body coil during a process in which the examination table carrying the subject under examination enters the scanning bore of the magnetic resonance imaging system. The part determination module is configured to acquire the position of a part to be examined of the subject under examination on the basis of the scattering parameter curve. The control module is configured to move the examination table on the basis of the position of the part to be examined such that the part to be examined is located at the center of the scanning bore.

Specifically, the scattering parameter curve is generated on the basis of scattering parameters acquired when the subject under examination is located at different positions of the scanning bore.

Specifically, the scattering parameters are acquired on the basis of reflected power and output power of the body coil when the subject under examination is located at different positions of the scanning bore.

Specifically, the parameter acquisition module is further configured to apply preset input power to the body coil, monitor the output power and the reflected power of the body coil when the subject under examination is located at the different positions, and acquire the scattering parameters corresponding to the different positions on the basis of a ratio of the reflected power to the output power.

Specifically, the part determination module is further configured to determine the position of a local coil or a surface coil on the basis of a peak or valley position in the scattering parameter curve, and the position of the local coil or the surface coil is the position of the part to be examined.

Specifically, the part determination module is further configured to acquire the distance between the head or the foot and the lower abdomen of the subject under examination on the basis of the valley position in the scattering parameter curve, and calculate the distance between the head or the foot and the part to be examined on the basis of the distance between the head or the foot and the lower abdomen, so as to acquire the position of the part to be examined.

Other features and aspects will become clear through the following detailed description, accompanying drawings, and claims.

BRIEF DESCRIPTION OF THE DRAWINGS

The present invention may be better understood by means of the description of exemplary embodiments of the present invention with reference to accompanying drawings, in which.

DETAILED DESCRIPTION

Specific implementations of the present invention will be described in the following. It should be noted that during the specific description of the implementations, it is impossible to describe all features of the actual implementations in detail in this description for the sake of brief description. It should be understood that in the actual implementation of any of the implementations, as in the process of any engineering project or design project, a variety of specific decisions are often made in order to achieve the developer's specific objectives and meet system-related or business-related restrictions, which will vary from one implementation to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The terms "first," "second," and similar terms used in the description and claims of the patent application of the present invention do not denote any order, quantity, or importance, but are merely intended to distinguish between different constituents. The term "one", "a(n)", or a similar term is not meant to be limiting, but rather denote the presence of at least one. The term "include", "comprise", or a similar term is intended to mean that an element or article that appears before "include" or "comprise" encompasses an element or article and equivalent elements that are listed after "include" or "comprise", and does not exclude other elements or articles. The term "connect", "connected", or a similar term is not limited to a physical or mechanical connection, and is not limited to a direct or indirect connection.

Figure 1:
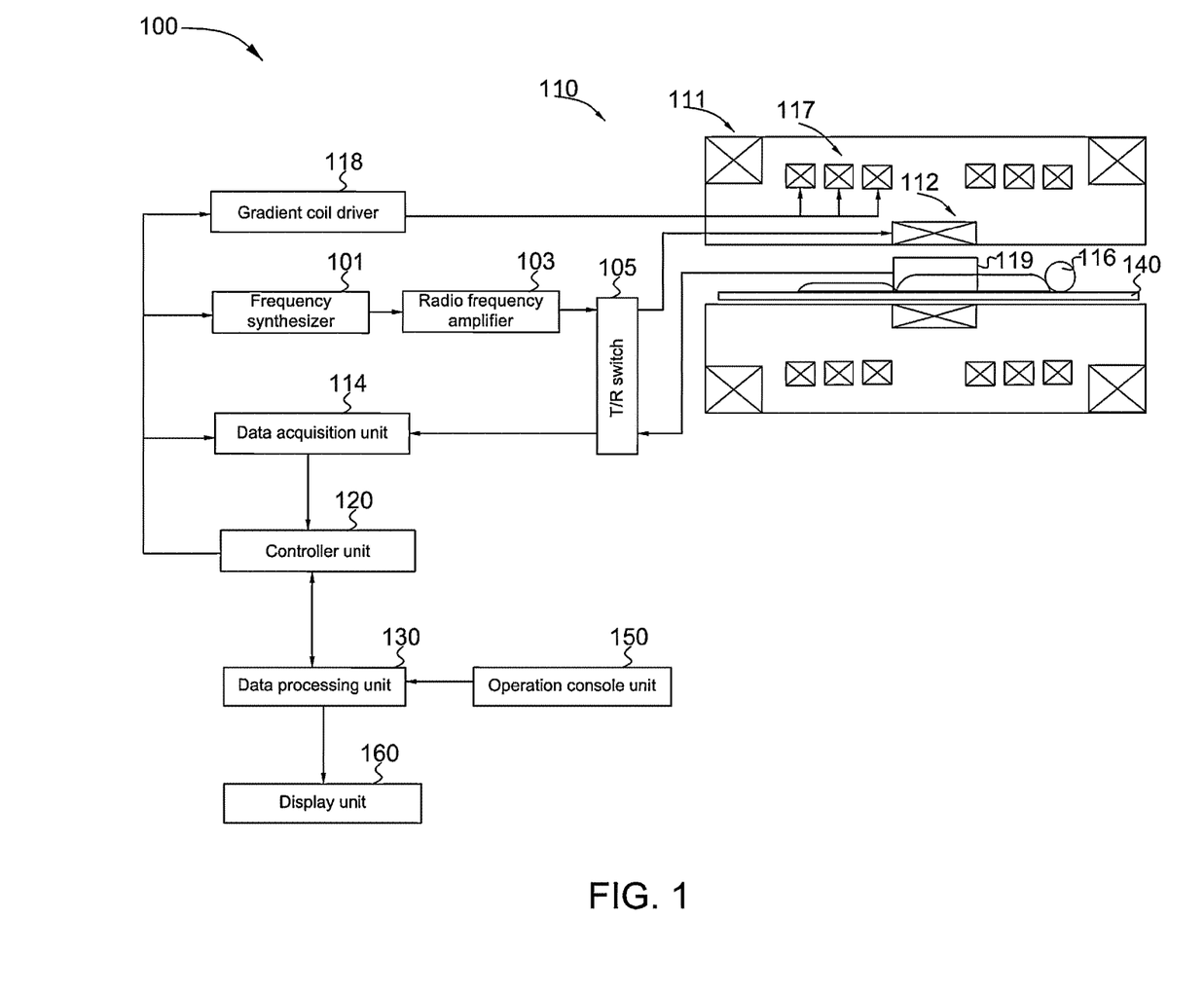
FIG. 1 is a schematic diagram of a magnetic resonance imaging system according to some embodiments of the present invention.

FIG. 1 shows a schematic diagram of an MRI system 100 according to some embodiments of the present invention. As shown in FIG. 1, the MRI system 100 includes a scanner 110, a controller unit 120, and a data processing unit 130. The MRI system 100 is described only as an example. In other embodiments, the MRI system 100 may have various variations, as long as image data can be acquired from a subject under examination.

The scanner 110 may be configured to obtain data of a subject 116 under examination. The controller unit 120 is coupled to the scanner 110 to control the operation of the scanner 110. The scanner 110 may include a main magnet 111, a radio frequency transmit coil 112, a radio frequency transmit link (not shown), a gradient coil system 117, a gradient coil driver 118, and a radio frequency receive coil 119.

The main magnet 111 generally includes, for example, an annular superconducting magnet. The annular superconducting magnet is mounted in an annular vacuum container. The annular superconducting magnet defines a cylindrical space, namely a scanning bore, surrounding the subject 116 under examination. The main magnet 11 may generate a constant main magnetic field such as a main magnetic field B0 in a Z direction of the cylindrical space. The MRI system 100 uses the generated main magnetic field B0 to emit a magnetostatic pulse signal to the subject under examination 116 placed in an imaging space, so that precession of protons in the body of the subject under examination 116 is ordered to generate a longitudinal magnetization vector.

The radio frequency transmit link includes a frequency synthesizer 101, a radio frequency amplifier 103, and a transmitting/receiving (T/R) switch 105.

The frequency synthesizer 101 is configured to generate a radio frequency pulse. The radio frequency pulse may include a radio frequency excitation pulse. The radio frequency excitation pulse is amplified by the radio frequency amplifier 103 and is then applied to the radio frequency transmit coil 112 by the T/R switch 105, so that the radio frequency transmit coil 112 emits to the subject under examination 116 a radio frequency magnetic field B1 orthogonal to the main magnetic field B0 so as to excite nuclei in the body of the subject under examination 116, and the longitudinal magnetization vector is converted into a transverse magnetization vector. After the end of the radio frequency excitation pulse, a free induction decay signal, i.e., a magnetic resonance signal that can be acquired, is generated in the process in which the transverse magnetization vector of the subject 116 under examination gradually returns to zero.

The radio frequency transmit coil 112 may be a body coil, wherein the body coil may be connected to the T/R switch 105. Through control of the T/R switch, the body coil can be switched between a transmit mode and a receive mode. In the receive mode, the body coil may be configured to receive a magnetic resonance signal from the subject 116 under examination. In addition, the radio frequency transmit coil 112 may also be a local coil, such as a head coil.

In some embodiments, the radio frequency transmit coil is not limited to the body coil and local coil mentioned in the present application, and may also include other appropriate types of appropriate coils. The radio frequency receive coil is also not limited to the body coil, local coil, and surface coil mentioned in the present application, and may also include other appropriate types of coils.

The gradient coil system 117 forms a magnetic field gradient in the imaging space so as to provide three-dimensional position information for the magnetic resonance signal described above. The magnetic resonance signal may be received by the radio frequency receive coil 119, or by the body coil or the local coil in the receive mode. The data processing unit 130 may process the received magnetic resonance signal so as to obtain required images or image data.

Specifically, the gradient coil system 117 may include three gradient coils. Each of the three gradient coils generates a gradient magnetic field inclined to one of three spatial axes (for example, X-axis, Y-axis, and Z-axis) perpendicular to one another, and generates a gradient field according to imaging conditions in each of a slice selection direction, a phase-encoding direction, and a frequency-encoding direction. More specifically, the gradient coil system 117 applies a gradient field in the slice selection direction of the subject 116 under examination to select a slice. The radio frequency transmit coil 112 emits a radio frequency excitation pulse to the slice selected for the subject 116 under examination and excites the slice. The gradient coil system 117 also applies a gradient field in the phase-encoding direction of the subject 116 under examination so as to perform phase encoding on a magnetic resonance signal of the excited slice. The gradient coil system 117 then applies a gradient field in the frequency-encoding direction of the subject 116 under examination so as to perform frequency encoding on the magnetic resonance signal of the excited slice.

The gradient coil driver 118 is configured to respectively provide a suitable power signal for the aforementioned three gradient coils in response to a sequence control signal transmitted by the controller unit 120.

The scanner 110 may further include a data acquisition unit 114. The data acquisition unit 114 is configured to acquire a magnetic resonance signal received by a radio frequency surface coil 119 or the body coil. The data acquisition unit 114 may include, for example, a radio frequency preamplifier (not shown), a phase detector (not shown), and an analog-to-digital converter (not shown), wherein the radio frequency preamplifier is configured to amplify a magnetic resonance signal received by the radio frequency surface coil 119 or the body coil. The phase detector is configured to perform phase detection on the amplified magnetic resonance signal. The analog-to-digital converter is configured to convert the magnetic resonance signal on which the phase detection has been performed from an analog signal to a digital signal. The data processing unit 130 can perform processing such as calculation and reconstruction on the digitized magnetic resonance signal so as to acquire a medical image.

The data processing unit 130 may include a computer and a storage medium. A program of predetermined data processing to be executed by the computer is recorded on the storage medium. The data processing unit 130 may be connected to the controller unit 120 and perform data processing on the basis of a control signal received from the controller unit 120. The data processing unit 130 may also be connected to the data acquisition unit 114 to receive a magnetic resonance signal output by the data acquisition unit 114, so as to perform the aforementioned data processing.

The controller unit 120 may include a computer and a storage medium. The storage medium is configured to store a program executable by the computer, and when the computer executes the program, a plurality of components of the scanner 110 are enabled to implement operations corresponding to an imaging sequence. The data processing unit 130 may also be caused to perform predetermined data processing.

The storage medium of the controller unit 120 and the data processing unit 130 may include, for example, a ROM, a floppy disk, a hard disk, an optical disk, a magneto-optical disk, a CD-ROM, or a non-volatile memory card.

The controller unit 120 may be configured and/or arranged for use in different manners. For example, in some implementations, a single controller unit 120 may be used. In other implementations, a plurality of controller units 120 are configured to work together (for example, based on distributed processing configuration) or separately, where each controller unit 120 is configured to handle specific aspects and/or functions, and/or to process data used to generate a model used only for a specific medical imaging system 100. In some implementations, the controller unit 120 may be local (for example, in the same place as one or a plurality of medical imaging systems 100, for example, in the same facility and/or the same local network). In other implementations, the controller unit 120 may be remote and thus can only be accessed via a remote connection (for example, via the Internet or other available remote access technologies). In a specific implementation, the controller unit 120 may be configured in a manner similar to that of cloud technology, and may be accessed and/or used in a manner substantially similar to that of accessing and using other cloud-based systems.

The MRI system 100 further includes an examination table 140 for carrying and/or moving the subject 116 under examination. the subject under examination 116 may be moved into or out of the imaging space by moving the examination table 140 based on the control signal from the controller unit 120.

The MRI system 100 further includes an operation console unit 150 connected to the controller unit 120. The operation console unit 150 may send an acquired operation signal to the controller unit 120 so as to control operation states of the aforementioned components, for example, the examination table 140 and the scanner 110. The operation signal may include, for example, a scanning protocol and a parameter selected manually or automatically. The scanning protocol may include the aforementioned imaging sequence. In addition, the operation console unit 150 may transmit the obtained operation signal to the controller unit 120 to control the data processing unit 130, so as to obtain a desired image.

The operation console unit 150 may include a user input device such as a keyboard, a mouse, a voice activated controller, or any other suitable input devices, by which an operator may input an operation signal/control signal to the controller unit 120.

The MRI system 100 may further include a display unit 160 that may be connected to the operation console unit 150 to display an operation interface and may further be connected to the data processing unit 130 to display the image.

In some embodiments, the system 100 may be connected, via one or more configurable wired and/or wireless networks such as the Internet and/or a virtual private network, to one or more display units, cloud networks, printers, workstations, and/or similar apparatuses located locally or remotely.

Before the formal imaging scanning is performed, it is necessary to determine a region of interest of the subject under examination, that is, the position of the part to be examined, and move the examination table such that the part to be examined of the subject under examination is located at the center of the scanning bore. Therefore, provided in some embodiments of the present invention is a positioning device for a magnetic resonance imaging system. The positioning device may be a controller unit 120 or a part of the controller unit 120, of the positioning device may also be provided separately.

Figure 2:
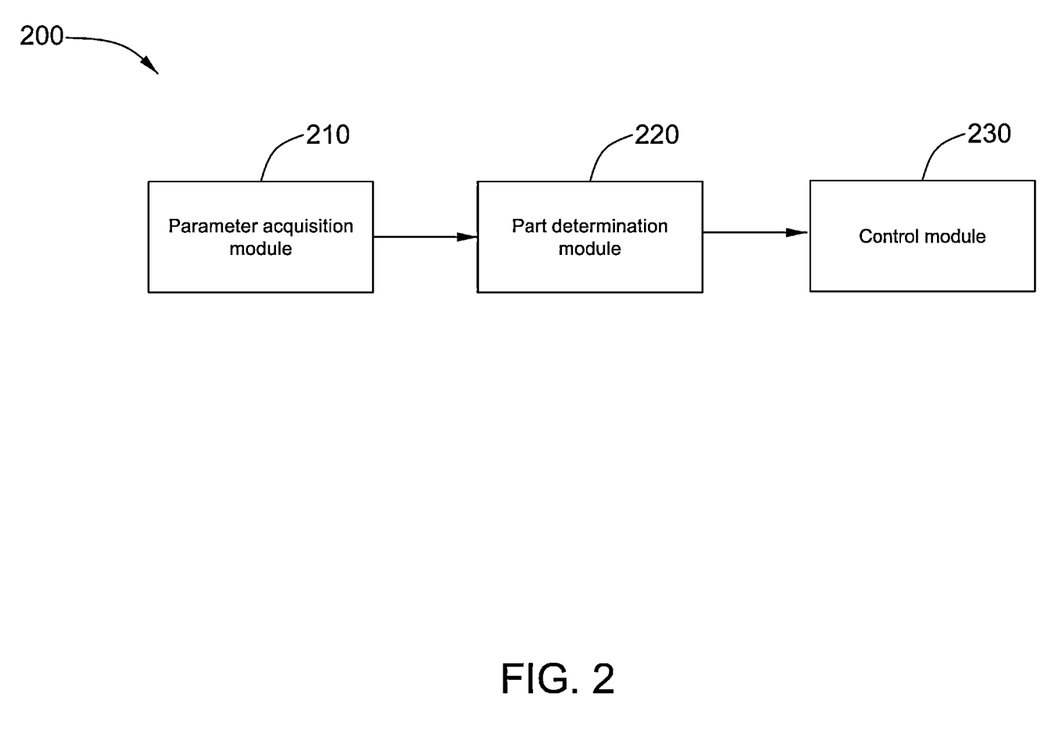
FIG. 2 is a schematic diagram of a positioning device for a magnetic resonance imaging system according to some embodiments of the present invention.

FIG. 2 is a schematic diagram of a positioning device 200 for a magnetic resonance imaging system according to some embodiments of the present invention. As shown in FIG. 2, the positioning device 200 includes a parameter acquisition module 210, a part determination module 220 and a control module 230. The parameter acquisition module 210 is configured to acquire a scattering parameter (S parameter for short) curve of a body coil during a process in which an examination table carrying a subject under examination enters a scanning bore of a magnetic resonance imaging system. The part determination module 220 is configured to acquire the position of a part to be examined of the subject under examination on the basis of the scattering parameter curve. The control module 230 is configured to move the examination table on the basis of the position of the part to be examined such that the part to be examined is located at the center of the scanning bore.

Specifically, the scattering parameter curve is generated on the basis of a plurality of corresponding scattering parameters when the subject under examination is located at different positions of the scanning bore.

The plurality of scattering parameters are acquired during positioning scanning, and the positioning scanning is performed before the formal imaging scanning. In some embodiments, the positioning scanning may be implemented at a pre-scanning stage.

Generally, the S parameter represent a load change in the body coil. At different positions of the subject under examination in a region covered by the body coil, loads at different positions vary because the ratios of fat and/or muscle or other parameters corresponding to the different positions of the subject under examination are different. Therefore, the S parameters corresponding to different positions are different.

Figure 3:
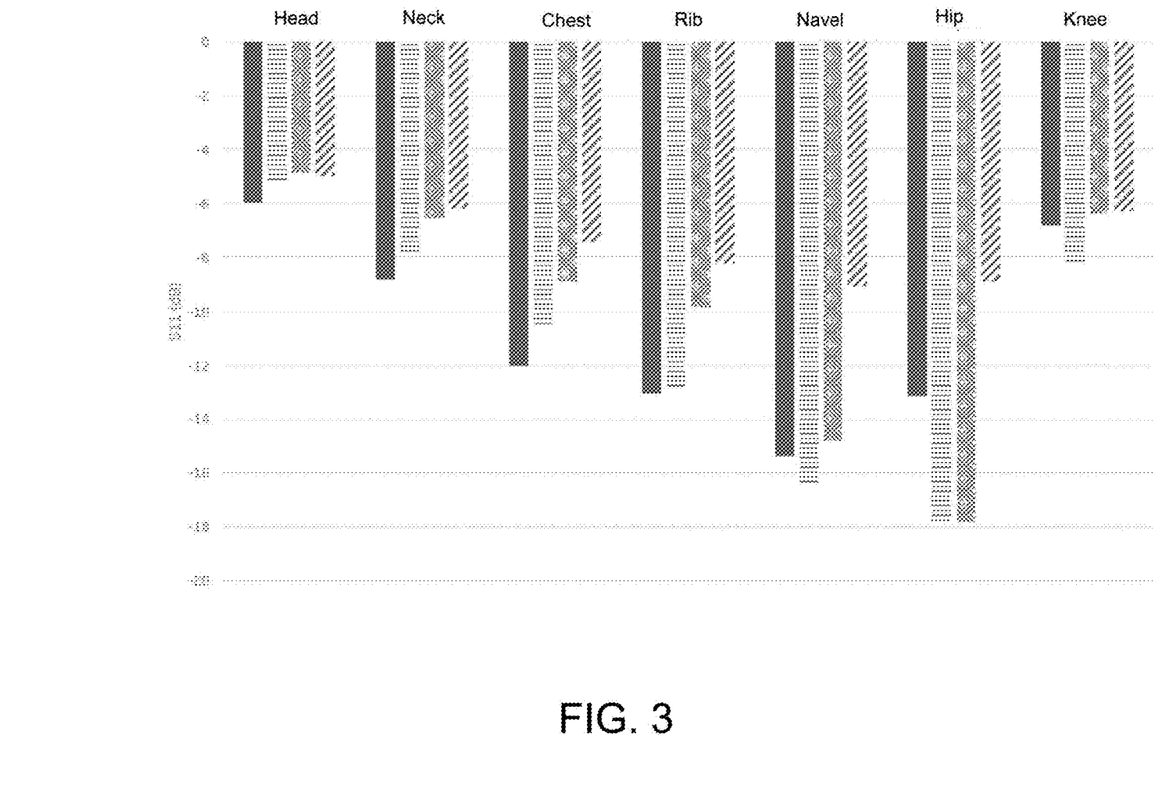
FIG. 3 is a schematic diagram of scattering parameter values corresponding to a plurality of parts of a plurality of subjects under examination.

FIG. 3 illustrates a schematic diagram of S parameter values corresponding to different parts of a plurality of subjects under examination. As shown in FIG. 3, horizontal coordinates represent different parts, and vertical coordinates represent S parameters. Four groups of data corresponding to each part represent four different subjects under examination, including a first subject under examination, a second subject under examination, a third subject under examination and a fourth subject under examination from left to right. The data shown in FIG. 3 are S parameter values obtained without the presence of a local coil and a surface coil. Although the S parameter values of the same part (e.g., chest) of the four subjects under examination are different, the minimum value of the S parameter of each subject under examination is obtained between navel and hip, that is, at the lower abdomen.

Specifically, the scattering parameters are acquired on the basis of reflected power and output power of the body coil when the subject under examination is located at different positions of the scanning bore. Specifically, the parameter acquisition module 210 is further configured to apply preset input power to the body coil, monitor the output power and reflected power of the body coil when the subject under examination is located at the different positions, and acquire the scattering parameters corresponding to the different positions on the basis of a ratio of the reflected power to the output power.

In some embodiments, the preset input power is small power, which is much smaller than power applied to the body coil during formal imaging scanning. The preset input power may be applied to the body coil by means of a radio frequency transmit link. The input power is continuously applied during the process in which the examination table moves into the scanning bore, so as to acquire the corresponding S parameters when the examination table carrying the subject under examination moves to different positions. Continuous application may be performed continuously, or performed according to a certain time interval or an interval of the distance by which the examination table moves.

Specifically, the output power refers to power output from the body coil to the environment (the space in the scanning bore), and the reflected power refers to power reflected from the environment to the body coil. A monitoring module is provided at an output end of the body coil, so as to respectively acquire the output power and the reflected power of the body coil in real time. The S parameters can be calculated according to the reflected power and the output power. In some embodiments, although the output power and the reflected power are monitored separately, monitoring may be implemented in the same hardware.

Specifically, the scattering parameter curve is generated on the basis of a plurality of S parameters. The S parameters correspond to different positions of the examination table, and the different positions correspond to different positions of the subject under examination respectively. When the examination table starts to enter the scanning bore (or body coil) for, for example, but not limited to, 1 cm, the input power is applied, the output power and reflected power of the body coil are monitored to acquire the S parameter corresponding to the position, then when the examination table enters the scanning bore for 2 cm, the S parameter corresponding to the position is acquired, and the same operation is repeated until the end of the examination table enters the scanning bore. By connecting the plurality of acquired S parameters according to the positions, a scattering parameter curve can be obtained.

In some embodiments, the S parameters are acquired at an interval of a preset distance by which the examination table moves. The preset distance may be set relatively large to quickly obtain the S parameters and then determine the position of the part to be examined. The preset distance may also be set relatively small to accurately acquire the accurate position of the part to be examined.

Figure 4:
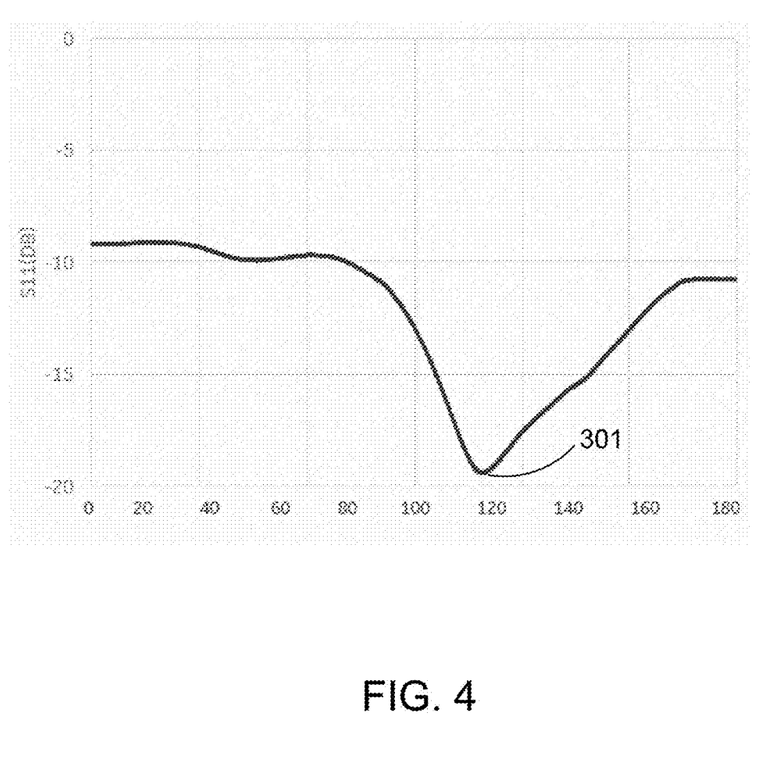
FIG. 4 is a schematic diagram of a scattering parameter curve of a subject under examination without the presence of a surface coil and a local coil.

FIG. 4 illustrates a schematic diagram of a scattering parameter curve of a subject under examination without the presence of a surface coil and a local coil. As shown in FIG. 4, the trend and approximate shape of the S parameter curve illustrated in FIG. 4 are similar to those of a histogram of the S parameters illustrated in FIG. 3. The S parameter value corresponding to the lower abdomen of the subject under examination (i.e., the position between the navel and the hip) is the smallest, that is, the valley position 301 in the scattering parameter curve in FIG. 4 corresponds to the lower abdomen position of the subject under examination.

Therefore, the part determination module 220 may be configured to acquire the distance between the head or the foot and the lower abdomen of the subject under examination on the basis of the valley position in the scattering parameter curve, and estimate the distance between the head or the foot and the part to be examined on the basis of the distance between the head or the foot and the lower abdomen, so as to acquire the position of the part to be examined.

Since there is a large difference in the S parameters of the body coil acquired under load and no load, that is, when the subject under examination starts to enter the scanning bore, the S parameters would change. Therefore, the position of the head or the foot can be acquired.

The positioning direction of the subject under examination is different. It may be that the head enters the scanning bore first or the foot enters the scanning bore first. In some embodiments, when the head enters the scanning bore first, the distance between the head and the part to be examined may be acquired by determining the distance between the head and the lower abdomen, while when the foot enters the scanning bore first, the distance between the foot and the part to be examined may be acquired by determining the distance between the foot and the lower abdomen. In some other embodiments, regardless of the positioning direction of the subject under examination, the distance between the head and the part to be examined may be acquired by determining the distance between the head and the lower abdomen. In some other embodiments, regardless of the positioning direction of the subject under examination, the distance between the foot and the part to be examined may be acquired by determining the distance between the foot and the lower abdomen.

Specifically, after the distance, for example, 80 cm, between the head and the lower abdomen is acquired by means of the scattering parameter curve, assuming that the part to be examined is the chest, since the chest is roughly located between the head and the lower abdomen, it can be determined that the distance between the chest and the head is approximately 40 cm, the position of the chest relative to the examination table can also be acquired accordingly. The distance between the head and the part to be examined may be estimated on the basis of information of the subject under examination, such as height and weight, or may be estimated on the basis of average ratios between respective parts.

Figure 5:
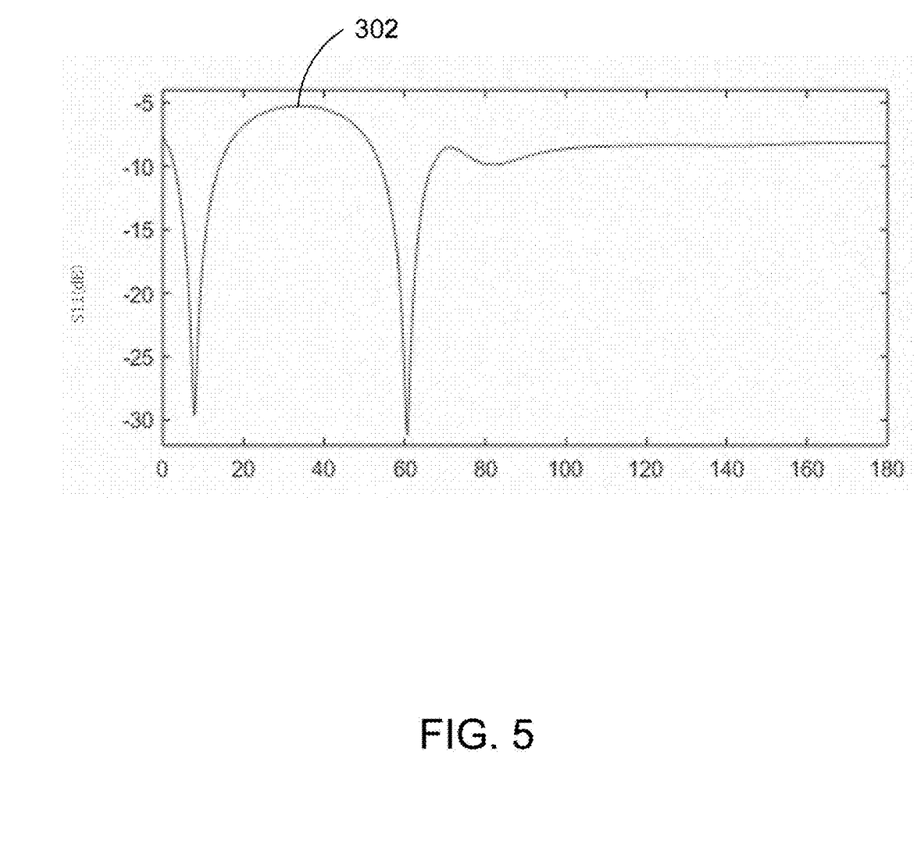
FIG. 5 is a schematic diagram of a scattering parameter curve of a subject under examination in the presence of a local coil.

FIG. 5 illustrates a schematic diagram of a scattering parameter curve of a subject under examination in the presence of a local coil. As shown in FIG. 5, when a local coil is present, it will have a great influence on the S parameter of the body coil. For example, referring to FIG. 5, a peak 302 is formed and the position of the peak 302 is the position of the local coil. Since the local coil is basically disposed or placed at the part to be examined, the position of the local coil is the position of the part to be examined.

Specifically, the peak refers to the position where values of two positions adjacent thereto are smaller than a value of this position.

Therefore, the part determination module 220 is further configured to determine the position of the local coil on the basis of the peak position in the scattering parameter curve, and the position of the local coil is the position of the part to be examined.

Figure 6:
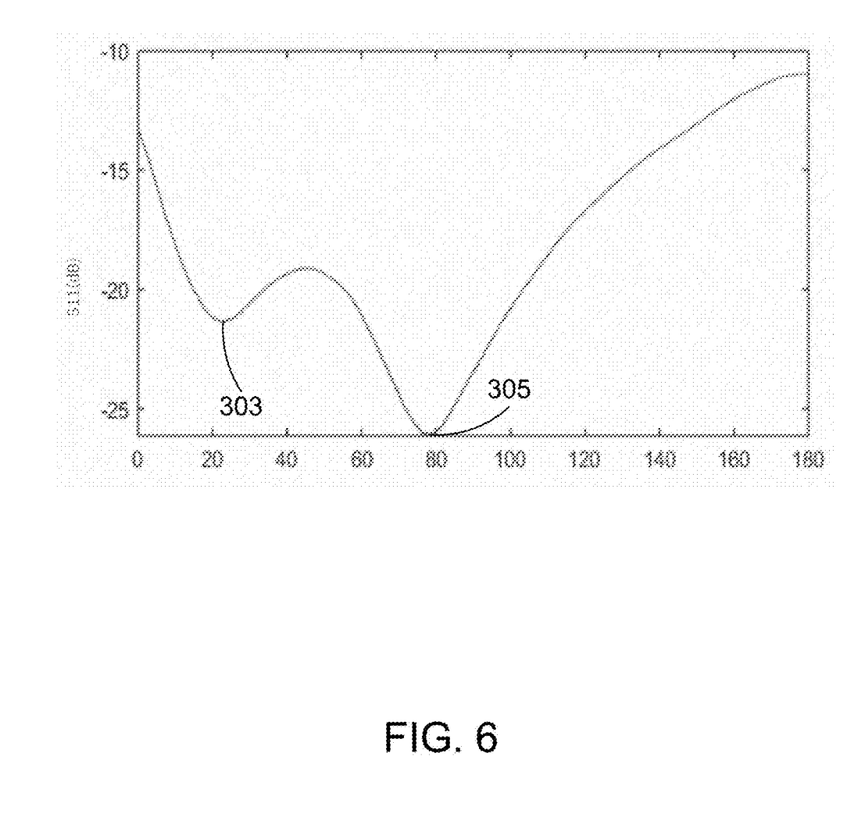
FIG. 6 is a schematic diagram of a scattering parameter curve of a subject under examination in the presence of a surface coil.

FIG. 6 illustrates a schematic diagram of a scattering parameter curve of a subject under examination in the presence of a surface coil. As shown in FIG. 6, when a surface coil is present, it will have a great influence on the S parameter of the body coil. For example, referring to FIG. 6, a first valley 303 and a second valley 305 are formed. The corresponding position of the first valley 303 is the position where a surface head/neck coil is placed, and the position of the second valley 305 is the position where a surface abdomen coil (e.g., blanket type surface coil) is placed.

Specifically, the valley refers to the position where values of two positions adjacent thereto are greater than a value of this position.

The position of the valley 303/305 is the position where the surface coil is located. Since the surface coil is basically disposed or placed at the part to be examined, the position of the surface coil is the position of the part to be examined.

Therefore, the part determination module 220 is further configured to determine the position of the surface coil on the basis of the valley position in the scattering parameter curve, and the position of the surface coil is the position of the part to be examined.

Figure 7:
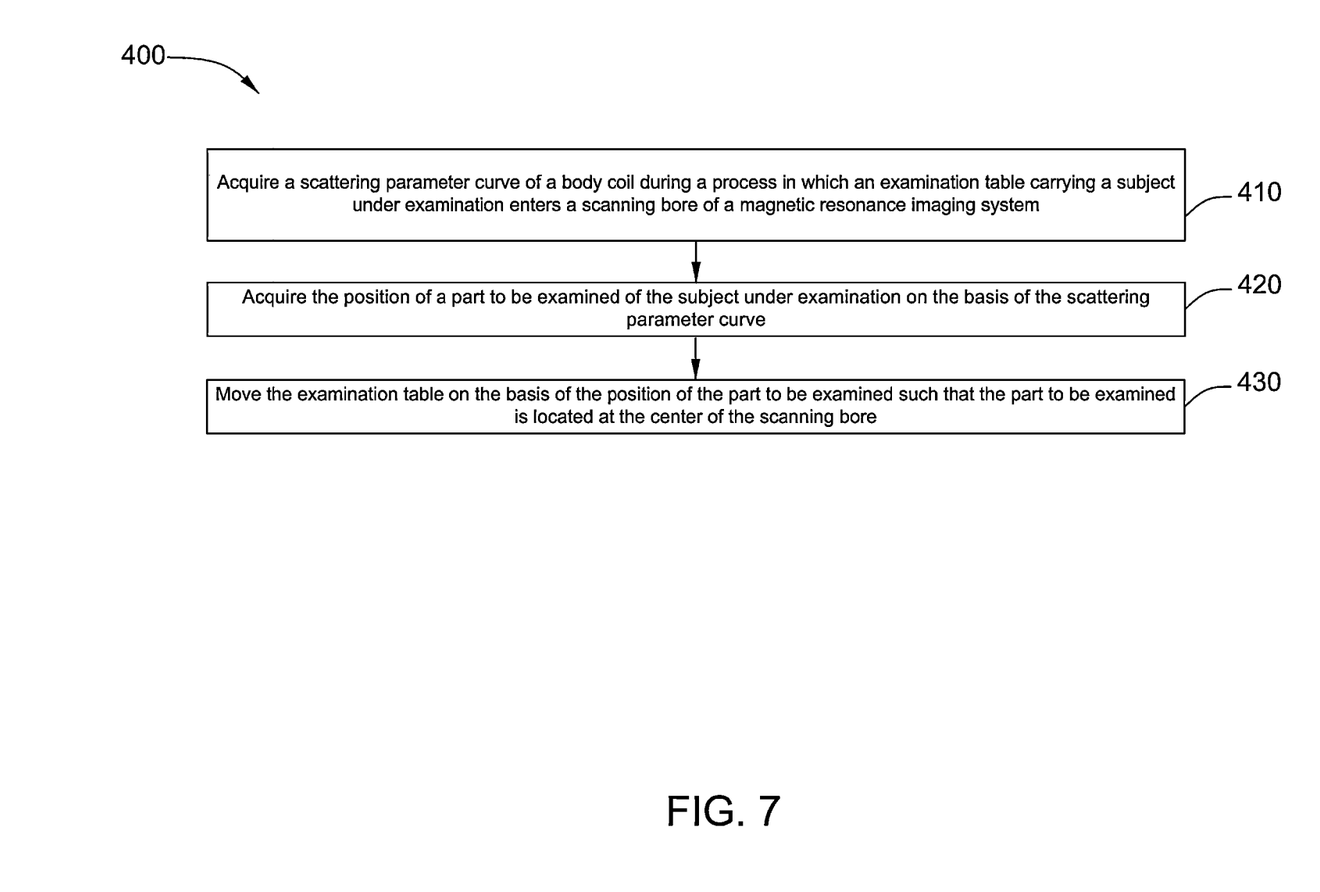
FIG. 7 is a flowchart of a positioning method for a magnetic resonance imaging system according to some embodiments of the present invention.

Although FIG. 7 illustrates the scattering parameter curve acquired in the presence of two surface coils at the same time, those skilled in the art should understand that the two surface coils do not necessarily exist at the same time, and only one surface coil may be used.

Therefore, when a local coil or a surface coil is arranged during scanning, since the local coil or the surface coil will be connected to the magnetic resonance imaging system by means of an interface, there will be a corresponding indication in the system to solve the problem in which the shapes of S parameter curves without the presence of a coil and in the presence of a surface coil are similar. Even if the system does not provide indication indicating connection with a local coil or a surface coil, the ranges of the minimum values of the S parameters acquired without the presence of a coil and in the presence of a surface coil are quite different, and the local coil and the surface coil may be distinguished according to the shape of the S parameter curve.

In some embodiments, the control module 230 is further configured to stop movement of the examination table when the peak or valley position in the scattering parameter curve is acquired, so as to further simplify the process and improve the efficiency. In some embodiments, the control module 230 is further configured to stop movement of the examination table when the position of the local coil or the surface coil is acquired, such that the local coil or the surface coil remains at the center of the scanning bore. The ranges of the minimum values of the S parameters without the presence of a coil and in the presence of a surface coil may be acquired through experiment or experience. Therefore, when the S parameter acquired at a position is within a preset range and the S parameter values corresponding to positions adjacent thereto are greater than the S parameter value corresponding to this position, it can be determined that this position is a position corresponding to the minimum value, that is, the valley position.

FIG. 7 illustrates a flowchart of a positioning method 400 for the magnetic resonance imaging system according to some embodiments of the present invention. As shown in FIG. 7, the positioning method 400 includes step 410, step 420, and step 430.

In step 410, a scattering parameter curve of a body coil is acquired during a process in which an examination table carrying a subject under examination enters a scanning bore of the magnetic resonance imaging system.

Specifically, the scattering parameter curve of the body coil is acquired during positioning scanning, and the positioning scanning is performed before formal imaging scanning. In some embodiments, the positioning scanning may be part of pre-scanning.

The scattering parameter curve is drawn on the basis of a plurality of scattering parameters, and the scattering parameters correspond to different positions of the subject under examination in the scanning bore. In some embodiments, the S parameters are acquired at an interval of a preset distance by which the examination table moves. The preset distance may be set relatively large to quickly obtain the S parameters and then determine the position of the part to be examined. The preset distance may also be set relatively small to accurately acquire the accurate position of the part to be examined.

Figure 8:
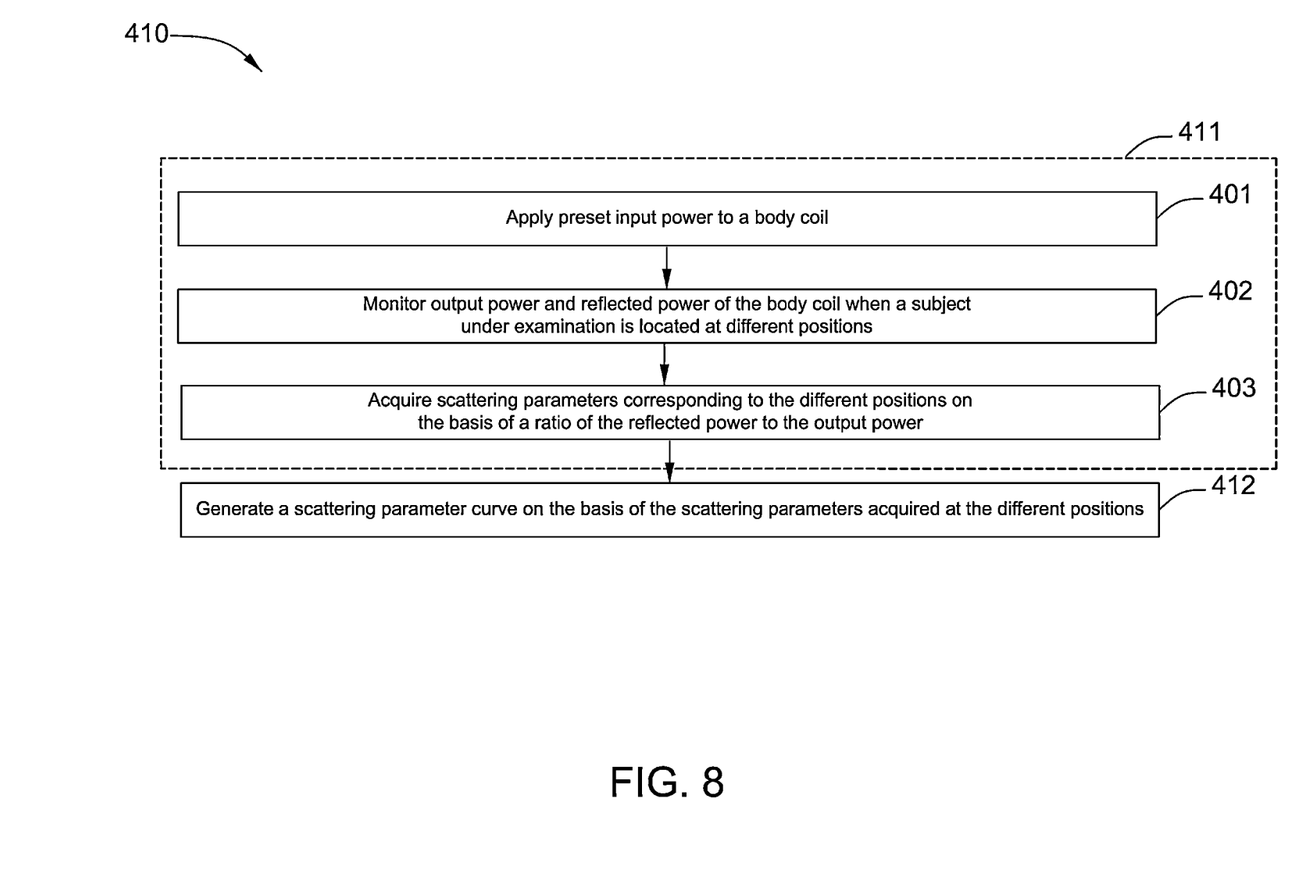
FIG. 8 is a specific flowchart of acquiring a scattering parameter curve of a body coil in the positioning method illustrated in FIG. 7.

FIG. 8 illustrates a specific flowchart of acquiring a scattering parameter curve of a body coil in the positioning method illustrated in FIG. 7. As shown in FIG. 8, the acquiring the scattering parameter curve of the body coil further includes step 411 and step 412.

In step 411, the scattering parameters are acquired when the subject under examination is located at different positions of the scanning bore.

In step 412, the scattering parameter curve is generated on the basis of the scattering parameters acquired at the different positions.

Specifically, the acquiring the scattering parameters at the different positions includes acquiring the scattering parameters of the body coil on the basis of reflected power and output power of the body coil when the subject under examination is located at the different positions.

In some embodiments, step 411 further includes step 401, step 402, and step 403.

In step 401, preset input power is applied to the body coil.

Specifically, the preset input power is small power, which is much smaller than power applied to the body coil during formal imaging scanning. The input power is applied to the body coil by means of a radio frequency transmit link. The input power is continuously applied during the process in which the examination table moves into the scanning bore, so as to acquire the corresponding S parameters when the examination table is located at different positions (different parts of the subject under examination).

In step 402, the output power and the reflected power of the body coil are monitored when the subject under examination is located at the different positions.

Specifically, the output power and the reflected power of the body coil may be acquired by means of a monitoring module provided at an output end of the body coil.

In step 403, the scattering parameters corresponding to the different positions are acquired on the basis of a ratio of the reflected power to the output power.

Please refer back to FIG. 7. In step 420, the position of a part to be examined of the subject under examination is acquired on the basis of the scattering parameter curve.

In some embodiments, the acquiring the position of the part to be examined of the subject under examination includes acquiring the distance between the head or the foot and the lower abdomen of the subject under examination on the basis of the valley position in the scattering parameter curve, and estimating the distance between the head or the foot and the part to be examined on the basis of the distance between the head or the foot and the lower abdomen, so as to acquire the position of the part to be examined.

Specifically, assuming that the part to be examined is the chest, after the distance between the head and the lower abdomen is acquired by means of the scattering parameter curve, since the chest is roughly located in the middle between the head and the lower abdomen, namely a position of about half said distance, the position of the chest relative to the examination table can also be acquired. The distance between the head and the part to be examined may be estimated on the basis of information of the subject under examination, such as height and weight, or may be estimated on the basis of average ratios between respective parts.

In some other embodiments, the acquiring the position of the part to be examined of the subject under examination includes determining the position of a local coil or a surface coil on the basis of a peak or valley position in the scattering parameter curve, and the position of the local coil or the surface coil is the position of the part to be examined.

In step 430, the examination table is moved on the basis of the position of the part to be examined such that the part to be examined is located at the center of the scanning bore.

In some embodiments, movement of the examination table is stopped when the peak or valley position in the scattering parameter curve is acquired, so as to further simplify the process and improve the efficiency. In some embodiments, movement of the examination table is stopped when the position of the local coil or the surface coil is acquired, such that the local coil or the surface coil remains at the center of the scanning bore.

To sum up, in the positioning method for the magnetic resonance imaging system according to some embodiments of the present invention, the position of the part to be examined of the subject under examination can be acquired by performing monitoring and acquiring the scattering parameter curve of the body coil, and then the examination table is moved such that the part to be examined is located at the center of the scanning bore, thus realizing automatic positioning or one-key positioning without installation of other equipment. The invention simplifies the process, reduces costs, and enables an operator to perform a positioning operation outside the scanning room.

The present invention may further provide a non-transitory computer-readable storage medium, for storing an instruction set and/or a computer program. When executed by a computer, the instruction set and/or computer program causes the computer to perform the aforementioned method for obtaining a predicted image of a truncated portion. The computer executing the instruction set and/or computer program may be a computer of an MRI system, or may be other devices/modules of the MRI system. In one embodiment, the instruction set and/or computer program may be programmed in a processor/controller of the computer.

Specifically, when executed by the computer, the instruction set and/or computer program causes the computer to:

acquire a scattering parameter curve of a body coil during a process in which an examination table carrying a subject under examination enters a scanning bore of the magnetic resonance imaging system;

acquire the position of a part to be examined of the subject under examination on the basis of the scattering parameter curve; and move the examination table on the basis of the position of the part to be examined such that the part to be examined is located at the center of the scanning bore.

The instructions described above may be combined into one instruction for execution, and any of the instructions may also be split into a plurality of instructions for execution. Moreover, the present invention is not limited to the instruction execution order described above.

As used herein, the term "computer" may include any processor-based or microprocessor-based system including a system that uses a microcontroller, a reduced instruction set computer (RISC), an application specific integrated circuit (ASIC), a logic circuit, and any other circuit or processor capable of executing the functions described herein. The above examples are merely exemplary and thus are not intended to limit the definition and/or meaning of the term "computer" in any manner.

The instruction set may include various commands that instruct a computer acting as a processor or instruct a processor to perform particular operations, such as the methods and processes of various embodiments. The instruction set may be in the form of a software program, and the software program can form part of one or a plurality of tangible, non-transitory computer-readable media. The software may be in various forms such as system software or application software. In addition, the software may be in the form of a set of independent programs or modules, a program module within a larger program, or part of a program module. The software may also include modular programming in the form of object-oriented programming. The input data may be processed by the processor in response to an operator command, or in response to a previous processing result, or in response to a request made by another processor.

Some exemplary embodiments have been described above; however, it should be understood that various modifications may be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementations also fall within the protection scope of the claims.

The invention claimed is:

1. A positioning method for a magnetic resonance imaging system, comprising:
   acquiring a scattering parameter curve of a body coil during a process in which an examination table carrying a subject under examination enters a scanning bore of the magnetic resonance imaging system;
   acquiring the position of a part to be examined of the subject under examination on the basis of the scattering parameter curve; and
   moving the examination table on the basis of the position of the part to be examined such that the part to be examined is located at the center of the scanning bore.

2. The positioning method according to claim 1, wherein the acquiring the scattering parameter curve of the body coil comprises:
   acquiring scattering parameters when the subject under examination is located at different positions of the scanning bore; and
   generating the scattering parameter curve on the basis of the scattering parameters acquired at the different positions.

3. The positioning method according to claim 2, wherein the acquiring the scattering parameters at the different positions comprises acquiring the scattering parameters of the body coil on the basis of reflected power and output power of the body coil when the subject under examination is located at the different positions.

4. The positioning method according to claim 3, wherein the acquiring the scattering parameters at the different positions further comprises:
   applying preset input power to the body coil;
   monitoring the output power and the reflected power of the body coil when the subject under examination is located at the different positions; and
   acquiring the scattering parameters corresponding to the different positions on the basis of a ratio of the reflected power to the output power.

5. The positioning method according to claim 4, wherein the present input power is applied to the body coil is smaller as compared to the power applied to the body coil during formal imaging scanning.

6. The positioning method according to claim 3, wherein the output power of the body coil refers to power output from the body coil to the environment and the reflected power refers to power reflected from the environment to the body coil.

7. The positioning method according to claim 2, wherein the scattering parameters represent load changes in the body coil.

8. The positioning method according to claim 1, wherein the acquiring the position of the part to be examined of the subject under examination comprises:
   determining the position of a local coil or a surface coil on the basis of a peak or valley position in the scattering parameter curve, and the position of the local coil or the surface coil is the position of the part to be examined.

9. The positioning method according to claim 1, wherein the acquiring the position of the part to be examined of the subject under examination comprises:

acquiring the distance between the head or the foot and the lower abdomen of the subject under examination on the basis of the valley position in the scattering parameter curve; and estimating the distance between the head or the foot and the part to be examined on the basis of the distance between the head or the foot and the lower abdomen, so as to acquire the position of the part to be examined.

10. A non-transitory computer-readable storage medium for storing a computer program, wherein when executed by a computer, the computer program causes the computer to execute the positioning method for the magnetic resonance imaging system according to claim 1.

11. A magnetic resonance imaging system, comprising:
a main magnet defining a scanning bore therein;
a body coil configured to transmit or receive a radio frequency signal;
an examination table configured to carry and move a subject under examination; and
a positioning device comprising:
   a parameter acquisition module configured to acquire a scattering parameter curve of the body coil during a process in which the examination table carrying the subject under examination enters the scanning bore of the magnetic resonance imaging system;
   a part determination module configured to acquire the position of a part to be examined of the subject under examination on the basis of the scattering parameter curve; and
   a control module configured to move the examination table on the basis of the position of the part to be examined such that the part to be examined is located at the center of the scanning bore.

12. The magnetic resonance imaging system according to claim 11, wherein scattering parameters are acquired on the basis of reflected power and output power of the body coil when the subject under examination is located at different positions of the scanning bore.

13. The magnetic resonance imaging system according to claim 12, wherein the parameter acquisition module is further configured to:
apply preset input power to the body coil;
monitor the output power and the reflected power of the body coil when the subject under examination is located at the different positions; and
acquire the scattering parameters corresponding to the different positions on the basis of a ratio of the reflected power to the output power.

14. The magnetic resonance imaging system according to claim 11, wherein the part determination module is further configured to determine the position of a local coil or a surface coil on the basis of a peak or valley position in the scattering parameter curve, and the position of the local coil or the surface coil is the position of the part to be examined.

15. The magnetic resonance imaging system according to claim 11, wherein the part determination module is further configured to acquire the distance between the head or the foot and the lower abdomen of the subject under examination on the basis of the valley position in the scattering parameter curve, and calculate the distance between the head or the foot and the part to be examined on the basis of the distance between the head or the foot and the lower abdomen, so as to acquire the position of the part to be examined.

* * * * *